United States Patent [19]

Manabe et al.

[11] Patent Number: 5,218,216

[45] Date of Patent: Jun. 8, 1993

[54] GALLIUM NITRIDE GROUP SEMICONDUCTOR AND LIGHT EMITTING DIODE COMPRISING IT AND THE PROCESS OF PRODUCING THE SAME

[75] Inventors: Katsuhide Manabe, Ichinomiya; Nobuo Okazaki, Konan; Isamu Akasaki, Machida; Kazumasa Hiramatsu, Yokkaichi; Hiroshi Amano, Hamamatsu, all of Japan

[73] Assignees: Toyoda Gosei Co., Ltd.; Nagoya University, both of Nagoya, Japan

[21] Appl. No.: 811,899

[22] Filed: Dec. 20, 1991

Related U.S. Application Data

[63] Continuation of Ser. No. 148,597, Jan. 26, 1988, abandoned.

[30] Foreign Application Priority Data

Jan. 31, 1987 [JP] Japan .................. 62-21124
Jan. 31, 1987 [JP] Japan .................. 62-21126

[51] Int. Cl.$^5$ .................. H01L 33/00; H01L 29/04
[52] U.S. Cl. .................. 257/103; 257/64
[58] Field of Search .................. 357/17, 30, 60, 61; 437/127, 976; 148/DIG. 97; 257/103, 64

[56] References Cited

U.S. PATENT DOCUMENTS

| | | | |
|---|---|---|---|
| 3,683,240 | 8/1972 | Pankove | 257/292 |
| 3,969,753 | 7/1976 | Thorsen, Jr. et al. | 357/60 |
| 4,001,858 | 1/1977 | Ballamy et al. | 357/14 |
| 4,065,750 | 12/1977 | Ballantyne | 357/6 |
| 4,111,725 | 9/1978 | Cho et al. | 148/175 |
| 4,152,182 | 5/1979 | Rutz | 148/175 |
| 4,207,586 | 6/1980 | Lebailly | 357/52 |
| 4,404,265 | 9/1983 | Manasevit | 428/689 |
| 4,408,217 | 10/1983 | Kobayashi | 357/17 |
| 4,473,938 | 10/1984 | Kobayashi | 29/569 |
| 4,608,581 | 8/1986 | Bagratishvili | 357/17 |
| 4,614,961 | 9/1986 | Khan et al. | 357/30 |
| 4,700,215 | 10/1987 | McPherson | 357/71 |
| 4,855,249 | 8/1989 | Akasaki | 437/81 |
| 4,908,074 | 3/1990 | Hosoi et al. | 148/33.2 |

FOREIGN PATENT DOCUMENTS

| | | | |
|---|---|---|---|
| 56-150880 | 11/1981 | Japan | 357/17 |
| 57-102081 | 6/1982 | Japan | 357/17 |
| 59-228776 | 12/1984 | Japan | 357/17 |
| 60-175468 | 9/1985 | Japan | 357/17 |
| 2123607 | 1/1984 | United Kingdom | 7/34 |

OTHER PUBLICATIONS

Shintani, et al., "X-Ray Diffraction Topography and Crystal Characterization of GaN . . . ", J. of Electrochemical Soc., vol. 125, # 12 (Dec. 1978), pp. 2076-2078.

Kawabata, et al., "GaN blue light emitting diodes prepared by metalorganic chemical vapor deposition", J. of Applied Physics, Oct. 1984, pp. 2367-2368.

Fitzl, et al., "Epitaxial Growth of GaN on (1012) oriented Sapphire in GaCl/NH$_3$/He and GaCl/NH$_3$/H$_2$ Systems", Crystal Research and Technology, vol. 15, No. 10, 1980, pp. 1143-1149.

Amano, et al., "Metalorganic vapor phase epitaxial growth of a high quality GaN film using an AlN buffer layer", Applied Physics Letters, Feb. 1986, vol. 48, No. 5, pp. 353-355.

Gaskill, et al., "Growth of GaN films using trimethylgallium and hydrazine", Applied Physics Letters, vol. 48, No. 21, May 1986, pp. 1449-1451.

*Primary Examiner*—William D. Larkins
*Assistant Examiner*—Stephen D. Meier
*Attorney, Agent, or Firm*—Cushman, Darby & Cushman

[57] ABSTRACT

A thin film of SiO$_2$ is patterned on an N layer consisting of N-type Al$_x$Ga$_{1-x}$N (inclusive of x=0). Next, I-type Al$_x$Ga$_{1-x}$N (inclusive of x=0) is selectively grown and the portion on the N layer grows into an I-layer consisting an active layer of a light emitting diode, and that on the SiO$_2$ thin film grows into a conductive layer. Electrodes are formed on the I-layer and conductive layer to constitute the light emitting diode. Also, on the surface a ({11$\bar{2}$0}) of a sapphire substrate, a buffer layer consisting of aluminum nitride is formed, onto which a gallium nitride group semiconductor is formed.

7 Claims, 9 Drawing Sheets

×300

×1000

×300

×1000

GALLIUM NITRIDE GROUP SEMICONDUCTOR AND LIGHT EMITTING DIODE COMPRISING IT AND THE PROCESS OF PRODUCING THE SAME

This is a continuation of application Ser. No. 07/148,597, filed on Jan. 26, 1988, now abandoned.

BACKGROUND OF THE INVENTION

The present invention relates to a gallium nitride group semiconductor and a light emitting diode comprising it and the process of producing the same.

In the past, the semiconductor and the light emitting diode formed by the vapor growth of a thin film of gallium nitride group semiconductor ($Al_xGa_{1-x}N$; inclusive of x=0) on a sapphire substrate using the process of metalorganic vapor phase epitaxy (hereinafter referred to as "MOVPE") have been studied.

The MOVPE forming the light emitting diode and the semiconductor is conducted by using a vapor growth apparatus as shown in FIG. 10. In the vapor growth apparatus, a manifold 6 is connected to a quartz reaction tube 7 and a supply system A of $NH_3$, a supply system B of $H_2$ and $N_2$, a supply system C of trimethylgallium (hereinafter referred to as "TMG") of an organometallic compound gas, a supply system D of trimethylaluminum (hereinafter referred to as "TMA") of the organmetallic compound gas and a supply system E of diethylzinc (hereinafter referred to as "DEZ") which is a reactant gas containing a doping element (hereinafter referred to as "dopant gas") are connected to the manifold 6. Also, in the quartz reaction tube 7, a high frequency heating graphite susceptor 9 is provided, on which a sapphire substrate 10 is disposed, which is heated by a high frequency coil 8. Each reactant gas and carrier gas from each supply system are mixed in the manifold 6, and the mixed gas is led to the quartz reaction tube 7 and blown against the sapphire substrate 10 to grow an $Al_xGa_{1-x}N$ thin film thereon.

Then, by changing the mixing ratio of each organometallic compound gas, the composition ratio can be changed and the insulated thin film of I-type (Intrinsic) $Al_xGa_{1-x}N$ can be formed by doping zinc.

Also, one example of the light emitting diode produced specifically by the aforementioned MOVPE is, as shown in FIG. 9, constructed as such that an N layer 12 consisting of N-type GaN and an I layer 13 consisting of I-type GaN formed by doping zinc are formed on the sapphire substrate 10, an electrode 15 is formed on the upper surface of the I layer 13 and an electrode 16 is formed on the side of the N layer 12 so that the both layers are luminous at their joint.

Since the sapphire substrate is utilized in the light emitting diode, the electrode 16 has to be positioned on the side of the N layer 12, encountering difficulty in production.

Meanwhile, when forming the electrode 16 of the N layer 12 on the same surface as the electrode 15 of the I layer 13, it has been attempted to form the electrode on the N layer exposed by removing an insulated film, after selectively forming the I layer by masking with the insulated film evaporated in a prescribed pattern.

However, since selective growth of the I layer with the insulated film mask is somewhat difficult and the I layer is formed also on the insulated film, making removal of the insulated film alone is difficult.

In the past, when the vapor growth of the gallium nitride group semiconductor takes place on the sapphire substrate, a surface c ($\{0001\}$) has been considered appropriate as the main surface which is involved in the crystal growth.

SUMMARY OF THE INVENTION

The inventors have discovered that by forming an AlN buffer layer on a surface a ($\{11\bar{2}\}$) of a sapphire substrate and growing a thin film of $Al_xGa_{1-x}N$ (inclusive of x=0) thereon, crystallinity of $Al_xGa_{1-x}N$ can be improved.

According to the present invention, since the sapphire substrate having the surface a ($\{11\bar{2}0\}$) as the main surface is easy to produce, various advantages in production are obtained, for example, a blue light emitting diode can be produced easily at a low cost.

Also, the inventors have, by employing a mechanism of selective growth, developed the light emitting diode structure and its process of production which is easy to produce and simple to handle.

That is, by pattern forming an $SiO_2$ thin film on the N layer consisting of $Al_xGa_{1-x}N$ (inclusive of x=0) and growing I-type $Al_xGa_{1-x}N$ (inclusive of x=0) thereon, portions on the N layer become the I layer as the active layer, and the other portions growing on the $SiO_2$ thin film become the conductive layer showing conductivity because they are non-single crystal. Thus, there is such an advantage as forming the I layer and conductive layer at the same time, and by forming the electrodes on the both layers the light emitting diode can be constructed to take out a lead wire from the same plane.

It is, therefore, a primary object of the present invention to provide a blue light emitting diode which is easy to produce and high in quality and the process of producing the same.

It is another object of the present invention to provide a gallium nitride group semiconductor growing on the sapphire substrate and having a good quality and the process of producing the same.

It is a further object of the present invention to provide a light emitting diode which is easy to produce and simple to handle and having electrodes formed on the same plane.

DESCRIPTION OF THE INVENTION

Figure 1:
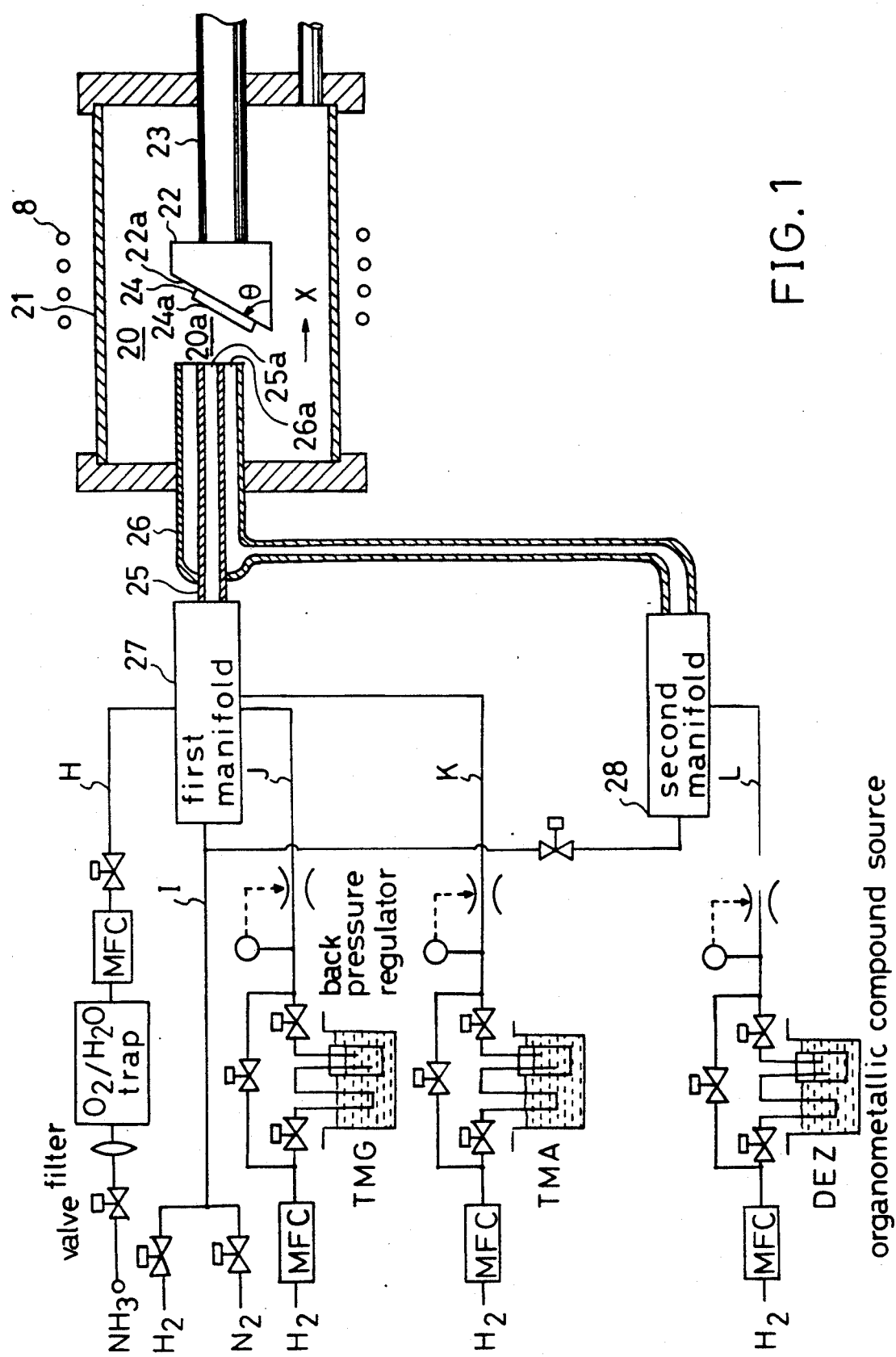
FIG. 1 is a structural view showing an apparatus for vapor growth for embodying the present invention.

The present invention will be described in the following referring to the specific embodiment. FIG. 1 is a structural view showing an apparatus for vapor growth for producing a semiconductor and a light emitting diode according to the present invention.

In a reaction chamber 20 surrounded by a quartz reaction tube 21, a susceptor 22 is supported by a control rod 23 for adjustment. On the main surface 22a of the susceptor 22, a sapphire substrate 24 having the main surface 24a which is subjected to the crystal growth is disposed. The numeral 8 generally denotes a high frequency coil for heating the sapphire substrate 24.

Meanwhile, on the gas inlet side of the reaction chamber 20, a first reactant gas tube 25 and a second reactant gas tube 26 are arranged. The first reactant gas tube 25 is disposed concentrically within the second reactant gas tube 26, the former being connected to a first manifold 27 and the latter being connected to a second manifold 28. To the first manifold 27, a supply system H of $NH_3$, a supply system I of a carrier gas, a supply system J of TMG and a supply system K of TMA are connected, and to the second manifold 28, the supply system I of the carrier gas and a supply system L of DEZ are connected.

Since the apparatus is constructed as such, from the opening 25a of the first reactant gas tube 25, mixed gas of $NH_3$, TMG, TMA and $H_2$ flows out into the reaction chamber 20, and from the opening 26a of the second reactant gas tube 26, a mixed gas of DEZ and $H_2$ flows out into the reaction chamber 20.

When forming an N-type $Al_xGa_{1-x}N$ thin film, the mixed gas may be introduced only from the first reactant gas tube 25, and when forming an I-type $Al_xGa_{1-x}N$ thin film, the mixed gas may be introduced respectively from the first reactant gas tube 25 and the second reactant gas tube 26. When forming the I-type $Al_xGa_{1-x}N$ thin film, DEZ which is the dopant gas is mixed with the reactant gases introduced from the first reactant gas tube 25 only at a reaction chamber 20a in the vicinity of the sapphire substrate 24. Then, DEZ is blown against the sapphire substrate and decomposed thermally, a dopant element is doped to growing $Al_xGa_{1-x}N$ to yield I-type $Al_xGa_{1-x}N$. In this case, since the reactant gas and dopant gas are completely separated by the first and second reactant gas tubes 25, 26 and led to a reaction chamber 20a near the sapphire substrate 24, reaction between DEZ and TMG or TMA within the feed tube of the gas occurred in the prior art apparatus is restrained, so that the doping is effected satisfactorily.

It is preferable that the openings 25a and 26a of the first and second reactant gas tubes 25, 26 and the sapphire substrate 24 are spaced at 10 to 60 mm. Also, an inclined angle $\theta$ of the main surface 22a of the susceptor 22 relative to the direction X of the reactant gas flow is set at 45°. In this arrangement, a better crystal was yielded as compared with the case where the susceptor 22 is arranged normally to the gas flow.

Next, utilizing the apparatus for vapor growth, the GaN thin film was formed on the sapphire substrate including the surface a ($\{11\bar{2}0\}$) as the main surface as follows.

First, the single crystal sapphire substrate 24 including the surface a ($\{11\bar{2}\}$) as the main surface, which is cleaned with the organic cleansing and heat treatment, is disposed on the main surface 22a of the susceptor 22. The sapphire substrate 24 is then subjected to the vapor etching at 1100° C. as feeding H from the first and second reactant gas tubes 25, 26 into the reaction chamber 20 at the flow rate of 0.3 l/min. Next, the heat treatment was performed for 1 minute as lowering the temperature to 950° C. and supplying $H_2$ at 3 l/min. $NH_3$ at 2 l/min. and TMA at $7\times10^{-6}$ mols/min. from the first reactant gas tube 25. By the heat treatment, an AlN buffer layer of 0.1 µm thick was formed on the sapphire substrate 24. The supply of TMA was suspended after one minute and the temperature of sapphire substrate 24 was kept at 970° C., then $H_2$ was supplied at 2.5 l/min., $NH_3$ at 1.5 l/min. and TMG at $1.7\times10^{-5}$ mols/min. for 60 minutes from the the first reactant gas tube 25 to form the GaN thin film of 7 µm thick.

Figure 2A:
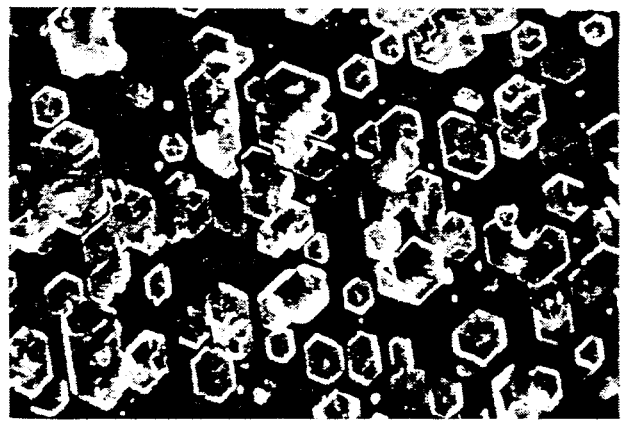
FIG. 2(a) and FIG. 2(b) are SEM images showing a surface morphology of a GaN thin film grown on a surface a ($\{11\bar{2}0\}$) of a sapphire substrate.
Figure 2B:
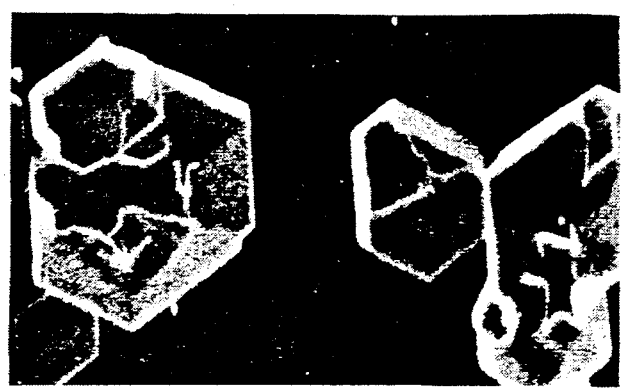
Figure 4:
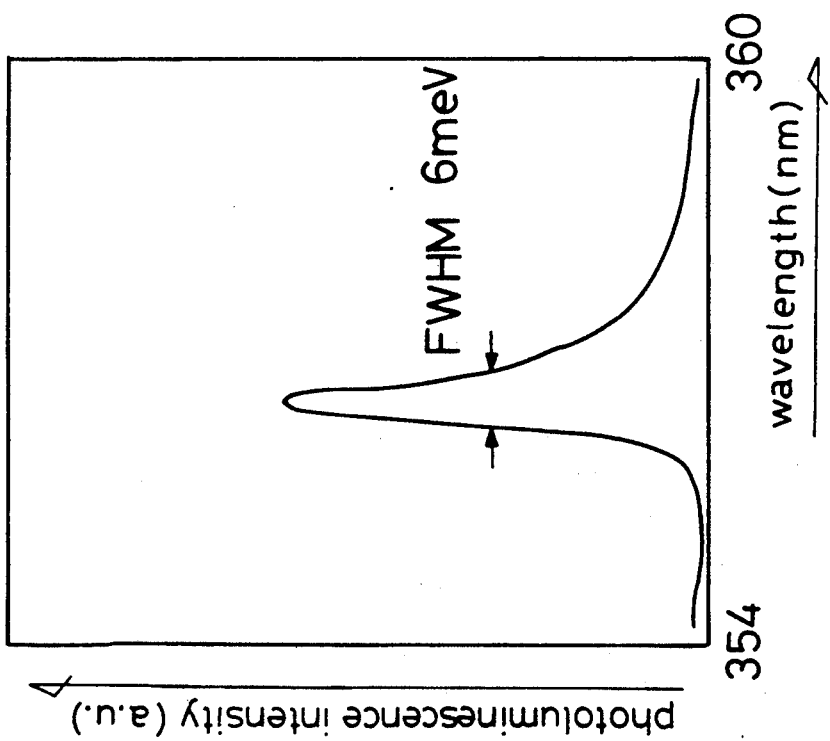
FIG. 4 is a measured curve showing a photoluminescence intensity characteristic of a GaN thin film grown on a surface a ($\{11\bar{2}0\}$) of a sapphire substrate.

SEM images of the GaN thin film surface thus formed are shown in FIG. 2 and its luminous characteristic by the photoluminescence is shown in FIG. 4.

Figure 3A:
FIG. 3(a) and FIG. 3(b) are SEM images showing a surface morphology of a GaN thin film grown on a surface c ($\{0001\}$) of a sapphire substrate.
Figure 3B:
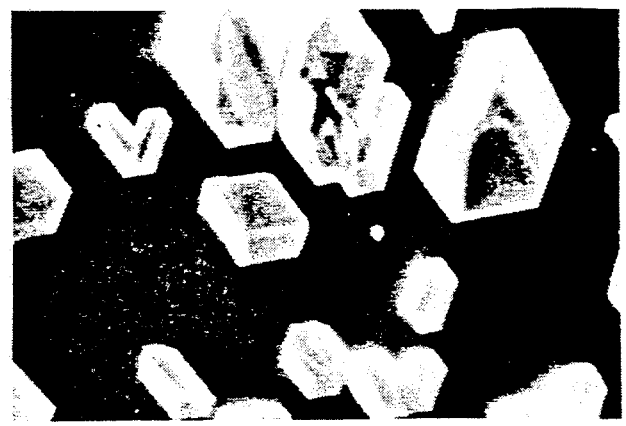
Figure 5:
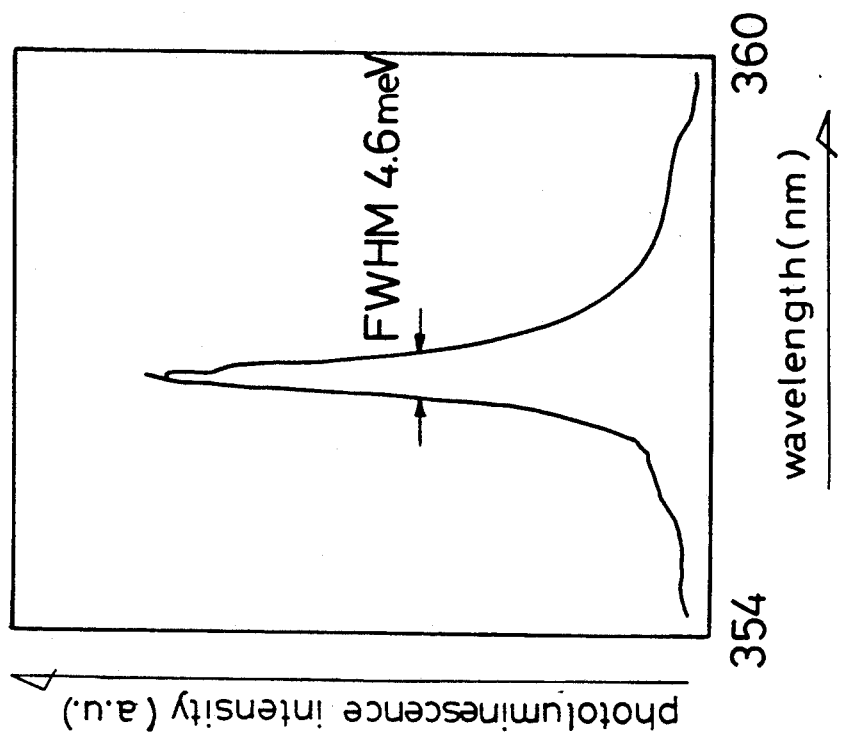
FIG. 5 is a measured curve showing a photoluminescence intensity characteristic of a GaN thin film grown on a surface c ($\{0001\}$) of a sapphire substrate.

Meanwhile, also on the sapphire substrate including the surface c ($\{0001\}$) as the main surface, the GaN thin film was grown as similarly as the aforementioned process. SEM images of the thin film surface are shown in FIG. 3 and its luminous characteristic by the photoluminescence is shown in FIG. 5.

As it is apparent from SEM image, the GaN thin film grown on the sapphire substrate of the surface a ($\{11\bar{2}\}$) has larger and more hexagonal crystals with better crystallinity compared to those grown on the sapphire substrate of the surface c ($\{0001\}$). While, in the characteristic of the photoluminescence intensity a half-width is 4.6 meV in the case of the surface c ($\{0001\}$) and that is 6 meV in the case of the surface a ($\{11\bar{2}\}$). Therefore, as far as viewing from the photoluminescence intensity crystallinity is generally same as that grown on the surface c ($\{0001\}$).

Figure 6:
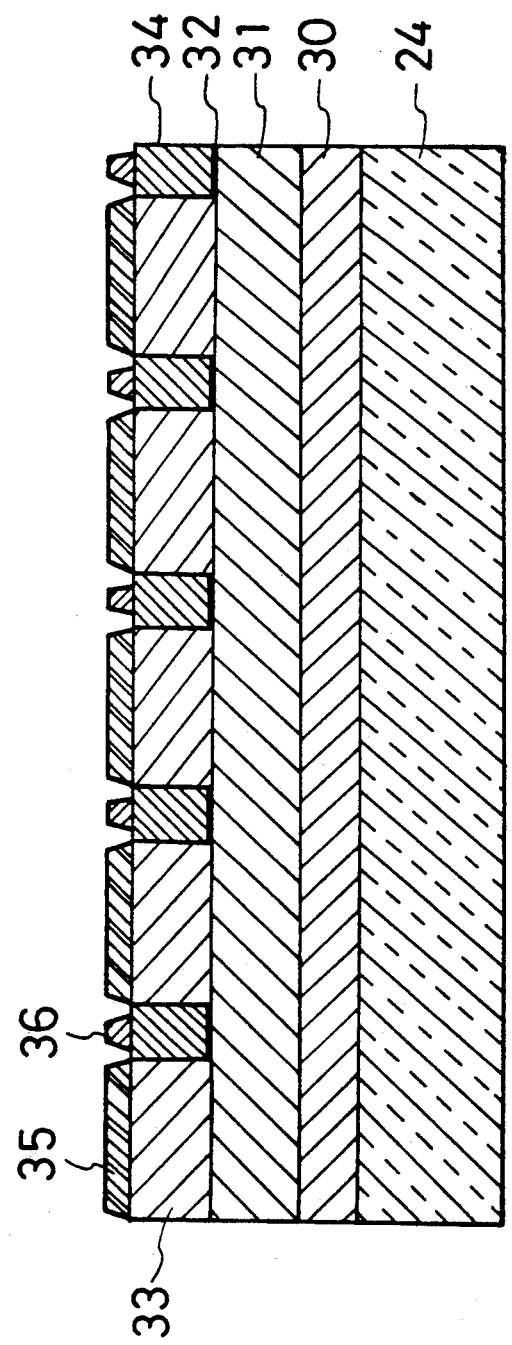
FIG. 6 is a sectional view showing the structure of a light emitting diode.

A process of producing a light emitting diode by the crystal growth of GaN on the sapphire substrate will be now described referring to FIG. 1 and FIG. 6.

The single crystal sapphire substrate 24 including the surface c ($\{0001\}$) as the main surface, which is cleaned by the organic cleansing and heat treatment, is first disposed on the main surface 22a of the susceptor 22. The sapphire substrate 24 was then subjected to the vapor etching at 1100° C. as feeding $H_2$ from the first and second reactant gas tubes 25, 26 into the reaction chamber 20 at a flow rate of 0.3 l/min. Next, the heat treatment was performed for 1 minute as lowering the temperature to 950° C. and supplying $H_2$ at 3 l/min., $NH_3$ at 2 l/min. and TMA at $7\times10^{-6}$ mols/min. from the first reactant gas tube 25, thereby a 0.1 µm thick AlN buffer layer 30 was formed. As suspending the supply of TMA after 1 minute and keeping the temperature of the sapphire substrate 24 at 970° C., $H_2$ was supplied at 2.5 l/min., $NH_3$ at 1.5 l/min. and TMG at $1.7\times10^{-5}$ mols/min from the first reactant gas tube 25 for 60 minutes to form an N layer 31 consisting of the N-type GaN thin film of about 7 µm thick. Next, the sapphire substrate 24 was taken out from the reaction chamber 20, and the main surface of the N layer 31 coated with a photoregist was etched after being exposed by using a mask with prescribed pattern to form the photoregist with prescribed pattern thereon. Using the photoregist as the mask, a SiO$_2$ film 32 of about 100 Å film thickness was patterned. Thereafter, the photoresist was removed and the sapphire substrate 24 patterned only with the SiO$_2$ film 32 was cleaned, remounted to the susceptor 22 and subjected to the vapor etching.

Then, as keeping the temperature of the sapphire substrate 24 at 970° C. and feeding H$_2$ at 2.5 l/min., NH$_3$ at 1.5 l/min. and TMG at $1.7 \times 10^{-5}$ mols/min. from the first reactant gas tube 25, and DEZ at $5 \times 10^{-6}$ mols/min. from the second reactant gas tube 26 for 5 minutes, an I layer 33 consisting of I-type GaN was grown to the film thickness of 1.0 μm. At this time, on the window portion where the N layer 31 of GaN is exposed, single crystal I-type GaN is grown to yield the I layer 33, but on the SiO$_2$ film 32, a conductive layer 34 consisting of polycrystalline GaN is formed. Since the conductive layer 34 is polycrystalline, it has conductivity.

Then, the sapphire substrate 24 was taken out from the reaction chamber 20, aluminum electrodes 35, 36 were evaporated on the I layer 33 and the conductive layer 34, and the sapphire substrate 24 was cut into a prescribed size to form the light emitting diode. In this case, the electrode 35 acts as the electrode for the I layer 33 and the electrode 36 for the N layer 31 through the conductive layer 34 and the very thin SiO$_2$ film 32. Then, by bringing the I layer 33 at a positive potential with respect to the N layer 31, a junction face between the two layers becomes luminous.

Figure 7B:
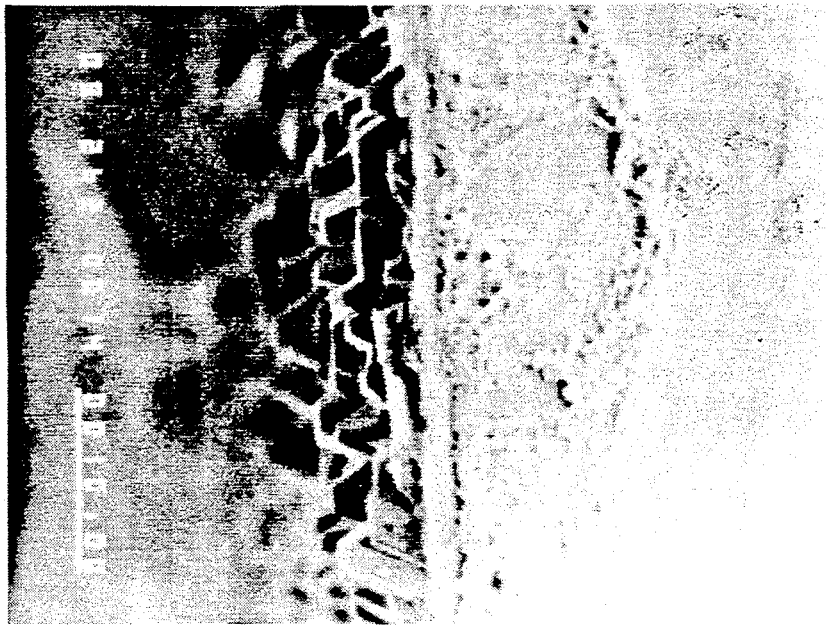
FIG. 7(b) is an SEM image showing a sectional construction of a GaN layer grown on a $SiO_2$ thin film.
Figure 7A:
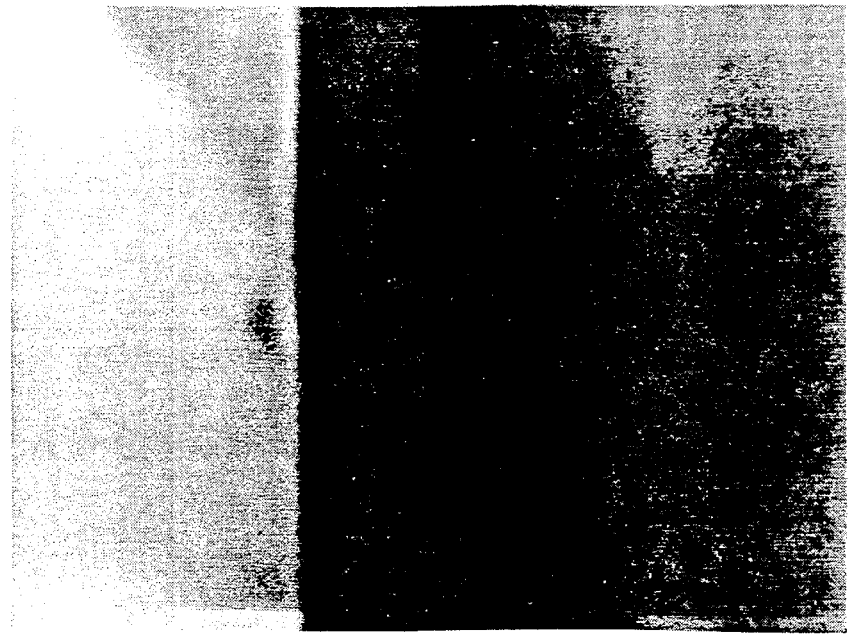
FIG. 7(a) is an SEM image showing a sectional construction of a GaN layer grown on an N layer.
Figure 8B:
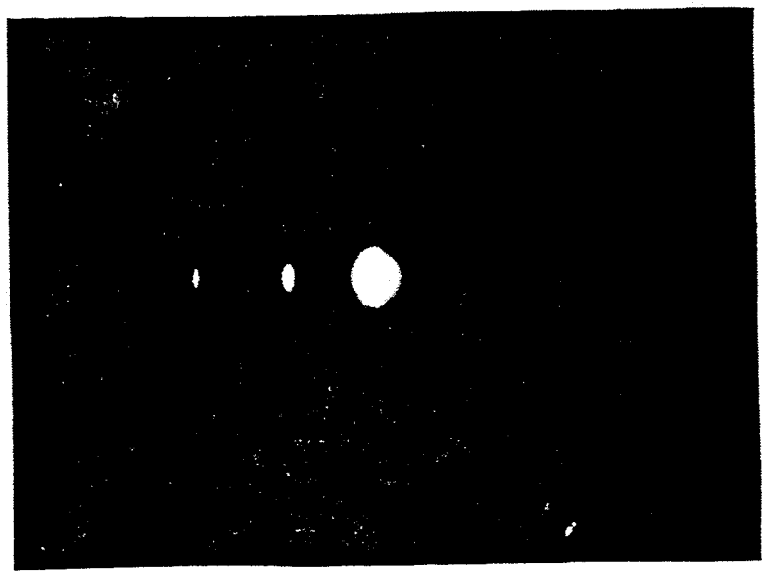
FIG. 8(b) is an RHEED pattern of a GaN layer grown on a $SiO_2$ film.
Figure 8A:
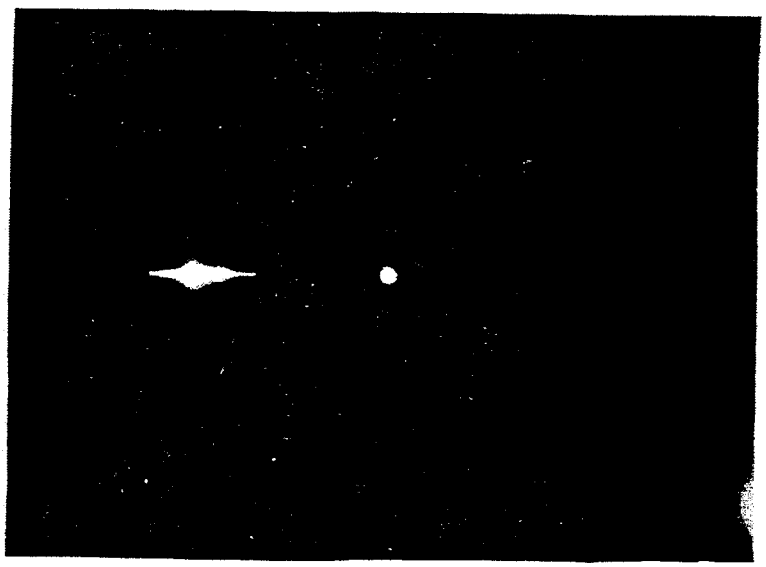
FIG. 8(a) is an RHEED pattern of a GaN layer grown on an N layer.
Figure 9:
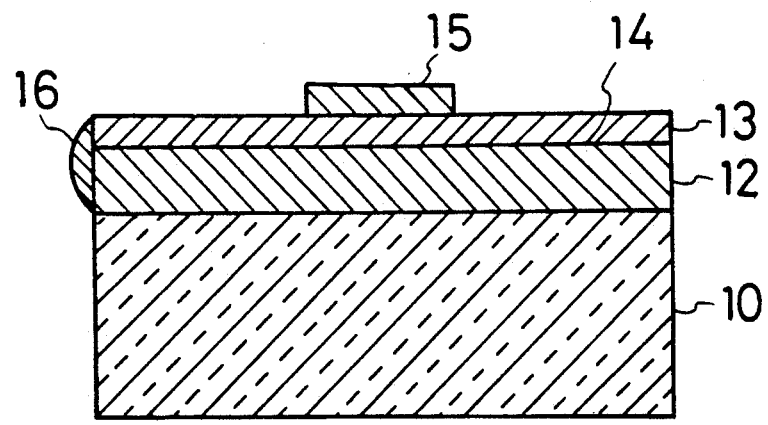
FIG. 9 is a sectional view showing the structure of a conventional light emitting diode.
Figure 10:
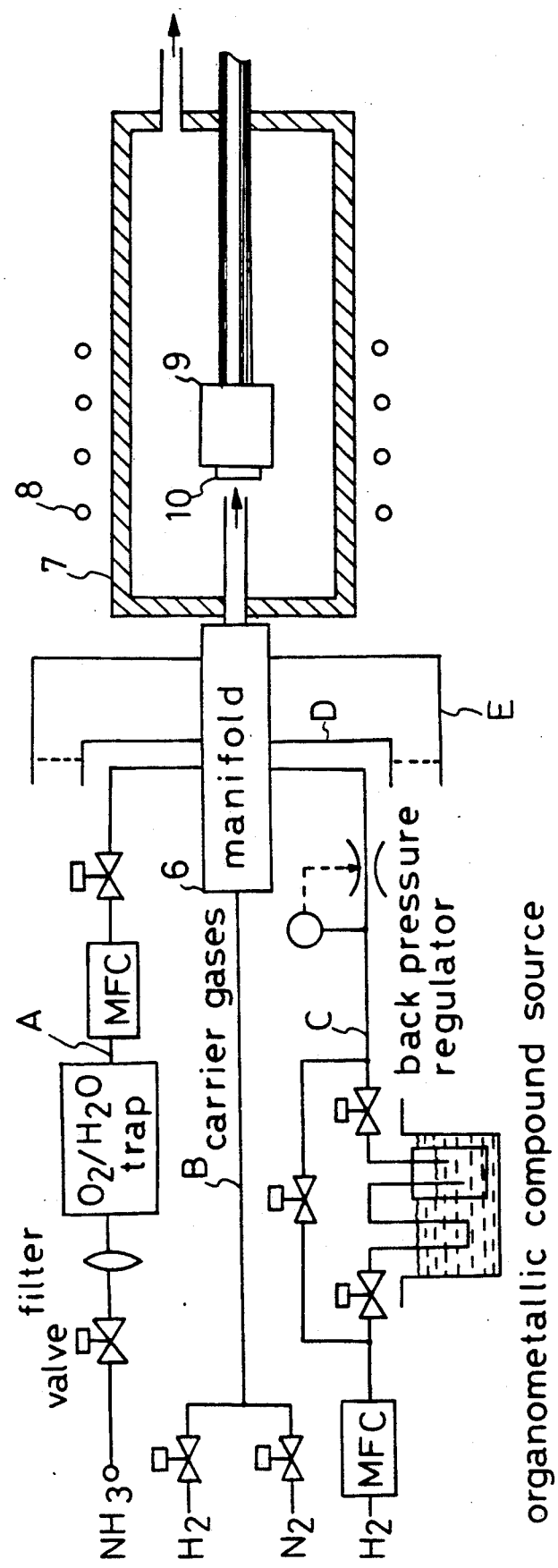
FIG. 10 is a structural view showing the structure of a conventional apparatus for vapor growth.

A sectional SEM image of the I layer 33 grown on the N layer 31 is shown in FIG. 7(a) and reflective high energy electron diffraction (RHEED) pattern is shown in FIG. 8(a). Also, an SEM image of the conductive layer 34 grown on the SiO$_2$ film 32 is shown in FIG. 7(b) and an RHEED pattern is shown in FIG. 8(b). As it will be apparent from these photographs, on N-type GaN, single crystal GaN is grown and on the SiO$_2$ film polycrystalline GaN is grown, which has a higher conductivity as compared with the former and forms the conductive layer 34 and acts as the lead with respect to the N layer 31.

In forming the Al$_x$Ga$_{1-x}$N group light emitting diode, TMA may be introduced from the first reactant gas tube 25 at a prescribed rate when forming the N layer 31 and I layer 33. For example, by maintaining the temperature of the sapphire substrate 24 at 1105° C. and supplying H$_2$ at 3 l/min., NH$_3$ at 2 l/min., TMA at $7.2 \times 10^{-6}$ mols/min and TMG at $1.7 \times 10^{-5}$ mols/min. from the first reactant gas tube 25 and DEZ at $5 \times 10^{-6}$ mols/min. from the second reactant gas tube 26, the I-type Al$_x$Ga$_{1-x}$N (x=0.3) group semiconductor thin film can be obtained.

In the light emitting diode mentioned above, though the surface c ({0001}) was selected as the main surface of the sapphire substrate, by selecting the surface a ({11$\bar{2}$0}) and employing the same process, the light emitting diode of better quality could be produced at a lower cost.

What is claimed is:

1. A gallium nitride group semiconductor light emitting diode comprising:
   a sapphire substrate having a surface a ({11$\bar{2}$0}), and
   a buffer layer of aluminum nitride (AlN) formed on said surface of said sapphire substrate.

2. A gallium nitride group semiconductor comprising:
   a sapphire substrate having a surface a ({11$\bar{2}$0}), and
   a buffer layer of aluminum nitride (AlN) formed on said surface of said sapphire substrate.

3. A gallium nitride group semiconductor light emitting diode comprising:
   a sapphire substrate,
   a buffer layer of aluminum nitride, AlN, formed on a surface of said sapphire substrate;
   an N layer of an N-type gallium nitride group semiconductor of a form Al$_x$Ga$_{1-x}$N, inclusive of X=0, formed on said buffer layer, carriers of which are electrons and which exhibit an N-type electric conduction;
   an SiO$_2$ very thin film, partially formed with a predetermined pattern on a surface of said N layer, and being sufficiently thin that electrons can pass therethrough to reach said N layer;
   a single crystalline I layer of an I-type gallium nitride group semiconductor of a form (Al$_x$Ga$_{1-x}$N, inclusive of X=0, which is selectively grown on exposed portions of said N layer and is an insulator, said I layer having an upper surface;
   an electric lead for conducting electrons to said N layer through said SiO$_2$ thin film, which is electrically conducting and is formed of a non-single crystalline structure selectively grown on said SiO$_2$ thin film in a simultaneous growing process with said I layer, said electric lead having an upper surface, and
   first and second electrode layers directly joined to said upper surfaces of said I layer and said electric lead, respectively.

4. The gallium nitride group semiconductor light emitting diode as claimed in claim 3, wherein the surface of said sapphire substrate is a surface "a" of a (1120) orientation.

5. The gallium nitride group semiconductor light emitting diode as claimed in claim 3, wherein the surface of said sapphire substrate is a surface "c" of an orientation (0001).

6. The gallium nitride group semiconductor light emitting diode as claimed in claim 3, wherein
   said SiO$_2$ very thin film is 20 to 400 angstroms in thickness.

7. A gallium nitride group semiconductor light emitting diode comprising:
   an N layer of N-type gallium nitride group semiconductor having a form Al$_x$Ga$_{1-x}$N, inclusive of X=0, carriers of which are electrons and which exhibits an N-type electric conduction;
   an SiO$_2$ thin film formed with a predetermined pattern on at least part of a surface of said N layer, and being sufficiently thin such that electrons can pass therethrough to reach said N layer;
   a single crystalline I layer of an I-type gallium nitride group semiconductor having a form Al$_x$Ga$_{1-x}$N, inclusive of X=0, which is selectively grown on exposed portions of said N layer and is an insulator, said I layer having an upper surface;
   an electric lead for conducting electrons to said N layer through said SiO$_2$ thin film, which is electrically conducting and is formed with a non-single crystalline portion, selectively growth on said SiO$_2$ very thin film in a simultaneous growing process with said I layer, said electric lead having an upper surface; and
   first and second electrode layers directly joined to said upper surfaces of said I layer and said electric lead, respectively, wherein
   said SiO$_2$ thin film is 20 to 400 angstroms in thickness.

* * * * *